(12) United States Patent
Yoo et al.

(10) Patent No.: US 10,943,860 B2
(45) Date of Patent: Mar. 9, 2021

(54) SEMICONDUCTOR DEVICE WITH FLEXIBLE CIRCUIT FOR ENABLING NON-DESTRUCTIVE ATTACHING AND DETACHING OF DEVICE TO SYSTEM BOARD

(71) Applicant: Micron Technology, Inc., Boise, ID (US)

(72) Inventors: Chan H. Yoo, Boise, ID (US); Eiichi Nakano, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/351,816

(22) Filed: Mar. 13, 2019

(65) Prior Publication Data

US 2019/0214331 A1     Jul. 11, 2019

Related U.S. Application Data

(63) Continuation of application No. 15/787,471, filed on Oct. 18, 2017, now Pat. No. 10,276,487.

(51) Int. Cl.
*H01L 23/498* (2006.01)
*H01L 23/00* (2006.01)
(Continued)

(52) U.S. Cl.
CPC ........ *H01L 23/4985* (2013.01); *H01L 21/568* (2013.01); *H01L 21/6835* (2013.01);
(Continued)

(58) Field of Classification Search
CPC .......... H05K 1/189; H05K 3/32; H05K 3/365; H05K 2201/051; H05K 2201/058;
(Continued)

(56) References Cited

U.S. PATENT DOCUMENTS

| 5,198,965 A | 3/1993 | Curtis et al. |
| 6,028,365 A | 2/2000 | Akram et al. |

(Continued)

FOREIGN PATENT DOCUMENTS

| CN | 1231954 C | 12/2005 |
| CN | 102365744 A | 2/2012 |

(Continued)

OTHER PUBLICATIONS

US Patent and Trademark Office; Office Action for U.S. Appl. No. 15/787,471 dated Jun. 20, 2018.
(Continued)

*Primary Examiner* — Thanhha S Pham
(74) *Attorney, Agent, or Firm* — Parsons Behle & Latimer (57) ABSTRACT

A semiconductor device assembly that includes a flexible member having a first portion connected to a substrate and a connector attached to a second portion of the flexible member. The connector is electrically connected to the substrate via a conducting layer within the flexible member. The substrate may be a semiconductor device, such as a chip. The connector may be configured to connect the semiconductor device to another semiconductor device assembly or a system board, such as a printed circuit board. A material may encapsulate at least a portion of the substrate of the semiconductor assembly. The semiconductor device assembly may be formed by selectively connecting the flexible member to a first substrate. A second substrate and connector may then be connected to the flexible member. A release layer may be used to release the assembly of the second substrate, flexible member, and connector from the first substrate.

11 Claims, 4 Drawing Sheets

(51) Int. Cl.
*H01L 21/56* (2006.01)
*H01R 12/77* (2011.01)
*H01L 41/047* (2006.01)
*H01L 23/538* (2006.01)
*H01L 23/31* (2006.01)
*H01L 21/683* (2006.01)
*H01R 12/62* (2011.01)
*H01R 12/71* (2011.01)
*H01R 12/70* (2011.01)

(52) U.S. Cl.
CPC .... *H01L 23/3121* (2013.01); *H01L 23/49811* (2013.01); *H01L 23/5387* (2013.01); *H01L 24/16* (2013.01); *H01L 24/81* (2013.01); *H01L 41/0475* (2013.01); *H01R 12/62* (2013.01); *H01R 12/778* (2013.01); *H01L 2221/68345* (2013.01); *H01L 2221/68359* (2013.01); *H01L 2224/0401* (2013.01); *H01L 2224/16227* (2013.01); *H01L 2224/16238* (2013.01); *H01L 2224/81005* (2013.01); *H01L 2224/97* (2013.01); *H01L 2924/15192* (2013.01); *H01L 2924/18161* (2013.01); *H01R 12/707* (2013.01); *H01R 12/7041* (2013.01); *H01R 12/716* (2013.01)

(58) Field of Classification Search
CPC ..... H01L 23/4985; H01L 24/16; H01L 24/81; H01L 21/21568
See application file for complete search history.

(56) References Cited

U.S. PATENT DOCUMENTS

| | | |
|---|---|---|
| 6,507,095 B1 | 1/2003 | Hashimoto |
| 6,797,891 B1 | 9/2004 | Blair et al. |
| 6,867,668 B1 | 3/2005 | Dagostino et al. |
| 8,193,555 B2 * | 6/2012 | Lin .................. H01L 27/14621 |
| | | 257/99 |
| 2003/0020152 A1 | 1/2003 | Inoue et al. |
| 2003/0233134 A1 | 12/2003 | Greenberg et al. |
| 2011/0143501 A1 | 6/2011 | Oda et al. |

FOREIGN PATENT DOCUMENTS

| | | |
|---|---|---|
| CN | 103037619 A | 4/2013 |
| CN | 105873359 A | 8/2016 |
| CN | 107078425 A | 8/2017 |

OTHER PUBLICATIONS

China National Intellectual Property Administration; Office Action for Application No. 201811134097. dated Nov. 30, 2020.

* cited by examiner

SEMICONDUCTOR DEVICE WITH FLEXIBLE CIRCUIT FOR ENABLING NON-DESTRUCTIVE ATTACHING AND DETACHING OF DEVICE TO SYSTEM BOARD

RELATED APPLICATIONS

The present application is a continuation patent application of U.S. patent application Ser. No. 15/787,471 entitled Semiconductor Device with Flexible Circuit for Enabling Non-destructive Attaching and Detaching of Device to System Board filed on Oct. 18, 2017, which is incorporated by reference herein in its entirety.

FIELD

The embodiments described herein relate to a flexible member having a connector that is connected to a substrate, which may be a semiconductor device such as, but not limited to, a single die of a silicon wafer, an integrated circuit, a monolithic integrated circuit, semiconductor chip, or a microchip. The connector is positioned away from the substrate, but is electrically connected to substrate via the flexible member.

BACKGROUND

Semiconductor processing and packaging techniques continue to evolve to meet industry demands for increased performance and reduced size. Electronic products, such as cell phones, smart phones, tablets, personal digital assistances, laptop computers, as well as other electronic devices, require packaged semiconductor assemblies having a high density of devices while having a relatively small footprint. The miniaturized semiconductor device assemblies are typically solder mounted onto a system board, such as a printed circuit board, within the device. The solder mounting of a semiconductor device assembly to a board makes it nearly impossible to detach the semiconductor device assembly without actually damaging the semiconductor device assembly. Thus, if the semiconductor device assembly quits working the entire board also quits working. It may be necessary to replace the entire board or even replace the entire device in the event only the semiconductor device assembly is not working properly. Additional drawbacks and disadvantages may exist.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor wafer, but semiconductor devices are not limited to semiconductor wafers.

As used herein, the terms "vertical," "lateral," "upper," and "lower" can refer to relative directions or positions of features in the semiconductor devices shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor device assemblies, and methods of making and/or operating semiconductor device assemblies. In one embodiment of the disclosure a semiconductor device assembly comprises a substrate and a flexible member having a connected layer, a first portion of the flexible member being connected to a bottom surface of the substrate. A connector is attached to a second portion of the flexible member with the connector being electrically connected to the substrate via a conducting layer or traces within the flexible member. The substrate may be a semiconductor devices such as a single die of a silicon wafer, an integrated circuit, a monolithic integrated circuit, semiconductor chip, or a microchip.

In one embodiment of the disclosure a semiconductor device assembly comprises a first substrate, a release layer on a surface of the first substrate, and a flexible layer having a conducting layer, wherein the release layer selectively bonds the flexible layer to the first substrate. The semiconductor device assembly includes a connector that is connected to the flexible layer and a second substrate that is electrically connected to the flexible member, the connector being electrically connected to the second substrate via the conducting layer, wherein the release layer is configured to selectively release an assembly of the flexible member, the connector, and the second substrate from the first substrate.

In one embodiment of the disclosure a method of forming a semiconductor device assembly comprises providing a first substrate and connecting a flexible member to a surface of the first substrate. The method comprises connecting a second substrate to the flexible member with a conducting layer of the flexible member being electrically connected to an electrical connection of the second substrate. The method includes providing a connector on a portion of the flexible member, the connector being electrically connected to the electrical connection of the second substrate via the conducting layer of the flexible member.

Figure 1:
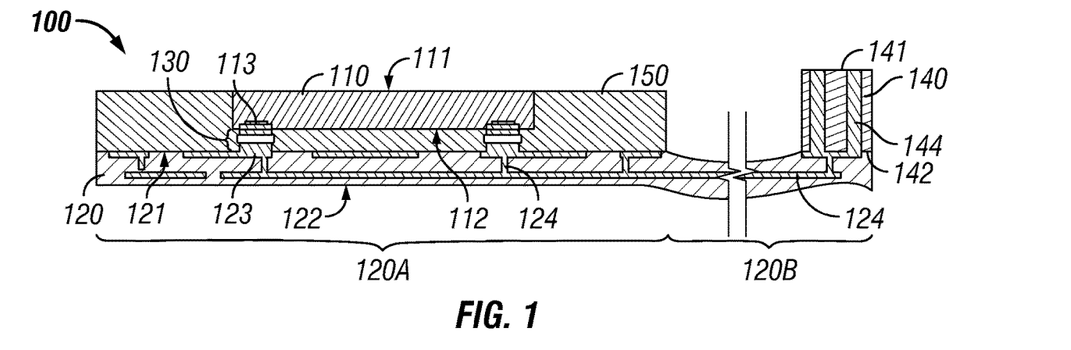
FIG. 1 is a schematic cross-section view of an embodiment of a semiconductor device assembly.

FIG. 1 is a schematic cross-section view of an embodiment of a semiconductor device assembly 100. The semiconductor device assembly 100 includes a substrate 110 having a first or top surface 111 and a second or bottom surface 112 positioned adjacent to a flexible member 120. The flexible member 120 includes a first or top surface 121 and a second or bottom surface 122. The top surface 121 of the flexible member 120 includes a plurality of pads 123 and the second surface of the substrate 110 includes a plurality of pillars 113, which permit the substrate 110 and the flexible member 120 to be connected together by connecting each pillar 113 to each pad 123 to form an interconnection 130 between the substrate 110 and the flexible member 120 as would be appreciated by one of ordinary skill in the art having the benefit of this disclosure.

A first portion 120A of the flexible member 120 is positioned adjacent to the substrate 110 and a second portion 120B of the flexible member 120 is positioned away from the substrate 120B as shown in FIG. 1. In other words, a portion 120B of the flexible member 120 may extend away from the substrate 110. A connector 140 is connected to the portion 120B of the flexible member 120 that is positioned away from the substrate 110. The connector 140 may be positioned at the end of the flexible member 120, as shown in FIG. 1. However, the connector 140 could potentially be positioned at various positions along the second portion 120B of the flexible member 120 depending on the application as would be appreciated by one of ordinary skill in the art having the benefit of this disclosure. The size, configuration, and/or shape of the substrate 110, flexible member 120, and/or connector 140 are shown for illustrative purposes only and may be varied depending on the application as would be appreciated by one of ordinary skill in the art having the benefit of this disclosure. For example, the second portion 120B of the flexible member 120 may be much longer than the first portion 120A of the flexible member 120.

The connector 140 includes a top end 141, a bottom end 142, and electrical connections 144 within the connector 140. The electrical connections 144 are electrically connected to electrical connections, which also may be referred to as traces, 124 positioned within the flexible member 120. The connector 140 may be configured to be selectively connected to a connector on a printed circuit board 300 (shown in FIG. 2). The electrical connections 144 of the connector 140 are electrically connected to the substrate 110 via the electrical connections 124 within the flexible member 120 and the interconnections 130 between the substrate 110 and the flexible member 120. A material 150 may be used to encapsulate at least a portion of the substrate 110. Likewise, the material 150 could encapsulate the portion of the flexible member 120 that is connected to the substrate 110, as well as the substrate 110, depending on the application as would be appreciated by one of ordinary skill in the art having the benefit of this disclosure. Encapsulation of the substrate 110 and/or a portion of the flexible member 120 may enable an additional structure, such as a heat sink, to be connected to the semiconductor device assembly 100 as would be appreciated by one of ordinary skill in the art having the benefit of this disclosure. Various materials could be used to encapsulate the substrate 110 and/or the flexible member 120. For example, the material 150 may be, but is not limited to, various non-conductive films and/or mold compounds.

The substrate 110 may comprises a semiconductor device. For example, the substrate may be, but is not limited to, a single die of a silicon wafer, an integrated circuit, a monolithic integrated circuit, semiconductor chip, or a microchip. Additionally, the substrate 110 may comprise a plurality of semiconductor devices that are connected together as would be appreciated by one of ordinary skill in the art having the benefit of this disclosure.

The flexible member 120 is configured to be more flexible than a typical semiconductor device. At typical room temperatures (e.g., 50 Fahrenheit to 90 Fahrenheit), the flexible member 120 may bend, flex, twist, or the like, without fracturing or breaking. Specifically, the portion 120B of the flexible member 120 is configured so that it may bend, or flex, to enable the connector 140 to be inserted into, or removed from, a connector of another semiconductor device assembly or a system board, such as a printed circuit board (PCB). The portion 120B of the flexible member 120 may enable the connector 140 to be inserted into or removed from a corresponding connection without the need to move the portion 120A of the flexible member 120 that is connected to the substrate 110, which may be a semiconductor device. The flexible member 120 may be comprised of various materials that enable the portion 120B of the flexible member 120 to be flexible. For example, the flexible member may be comprised of, but not limited to, a polyimide film, a polyetheretherketone film, a dielectric material, an organic dielectric material, combinations thereof, or the like. In an embodiment, the flexible member 120 may be freely bend throughout three hundred and sixty degrees. In other words, in an embodiment, the flexible member 120 may be rolled up into a roll.

The flexible member 120 may be comprised of various other materials depending on the application as would be appreciated by one of ordinary skill in the art having the benefit of this disclosure. The flexible member 120 includes a conducting layer or a plurality of conducting layers, also referred to as traces, that are also flexible and enable the electrical connection between the substrate 110 connected to a first portion 120A of the flexible member 120 and the connector 140, which is connected to a second portion 120B of the flexible member 120.

The connector 140 may be one of various types of connectors that may be used to selectively connect the semiconductor device assembly 100 to a PCB, or the like, as would be appreciated by one of ordinary skill in the art. The flexible member 120 and connector 140 may enable the semiconductor device assembly 100 to be selectively installed and removed from a PCB, or the like, without damaging the semiconductor device assembly as would be appreciated by one of ordinary skill in the art having the benefit of this disclosure.

Figure 2:
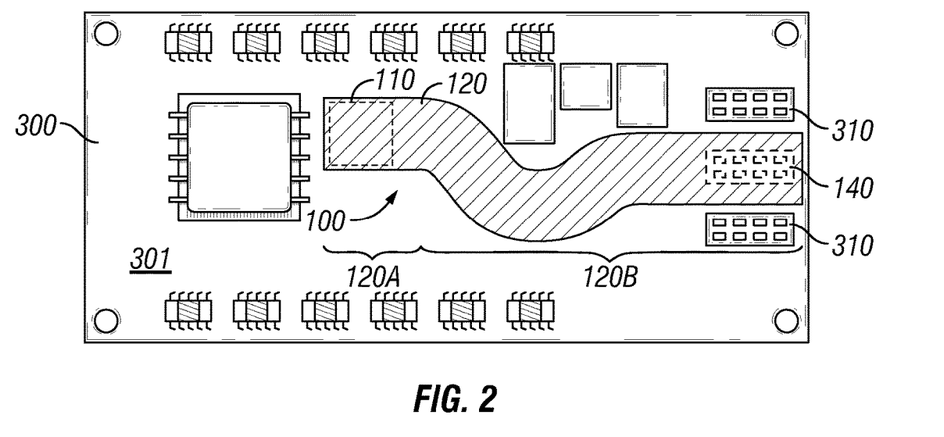
FIG. 2 is a schematic top view of an embodiment of a semiconductor device assembly connected to a printed circuit board.

FIG. 2 is a schematic top view of a PCB 300 with a semiconductor device assembly 100 positioned on a surface 301 of the PCB 300. The surface 301 of the PCB 300 may include a plurality of connector receptacles 310 as shown in FIG. 2. The semiconductor device assembly 100 including a substrate, which may be a semiconductor device, 110 is connected to the PCB 300 via a connector 140 connected to a connector receptacle 310. The substrate, or semiconductor device, 110 of the semiconductor devices assembly 100 is connected to the PCB 300 via a connection layer, or traces, within a flexible member 120, as discussed herein. The connector 140 is attached to the flexible member 120 and electrically connects the semiconductor device 110 with the PCB 300. As discussed herein, the flexible member 120 is connected to a substrate of semiconductor device 110 (shown in FIG. 1), which may be selectively attached to the PCB 300 via an epoxy, or the like, to hold the semiconductor device 110 in place. The epoxy used to selectively attach the semiconductor device 110 may be configured to permit the semiconductor device 110 to be later removed from the PCB 300 without damaging the semiconductor device 110 by various mechanisms as would be appreciated by one or ordinary skill in the art having the benefit of this disclosure.

Figure 3:
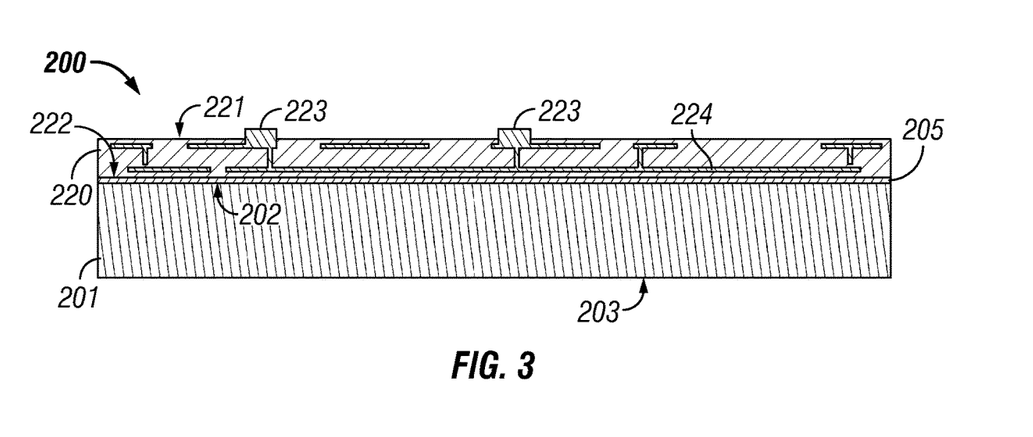
FIG. 3 is a schematic cross-section view of an embodiment of a semiconductor device assembly including a flexible member connected to first substrate.

FIGS. 3-7 are schematic cross-section views showing the various steps of forming of an embodiment of a semiconductor devices assembly 200. FIG. 3 shows a semiconductor assembly 200 that includes a first substrate 201 having a top or first surface 202 and a bottom or second surface 203. The first substrate 201 may be comprised of various materials. For example, the first substrate 201 may be glass, silicon, or various other materials as would be appreciated by one of ordinary skill in the art having the benefit of this disclosure. In some embodiments, the first substrate 201 may be a carrier wafer.

A release layer 205 is positioned on the top surface 202 of the first substrate 201. The release layer 205 may be a temporary bonding material that selectively bonds the flexible member 220 to the first substrate 201, as discussed herein. The release layer 205 may be an adhesive, or the like, that may be used to selectively attach a flexible member 220 to the first substrate 201 and subsequently, selectively release the flexible member 220 from the first substrate 201, as discussed herein. The release layer 205 may be an optical release layer. Various mechanisms may be used to selectively release the flexible member 220 from the release layer 205 and first substrate 201, as discussed herein.

A flexible member 220 having a first or top surface 221 and a second or bottom surface 222 is positioned on the release layer 205 on the top surface 202 of the first substrate 201. The top surface 221 of the flexible member 220 includes a plurality of pads 223, or the like, which may be used to create electrical interconnects with a second substrate 210 (shown in FIG. 4), as discussed herein. In some embodiments, the second substrate 210 may be comprised of a plurality of semiconductor devices electrically connected together as would be appreciated by one of ordinary skill in the art having the benefit of this disclosure. The flexible member 220 includes a conducting layer or layers 224, also referred to a traces, within the flexible member 220. The conducting layer or layers 224 is electrically connected to the plurality of pads 223 on the top surface 221 of the flexible member 200. The flexible layer 220 may be positioned onto the release layer 224 and thus, be selectively connected to the first substrate 201. In another embodiment, the flexible member 220 may be formed by depositing multiple layers onto the release layer 205 as would be appreciated by one of ordinary skill in the art having the benefit of this disclosure. The conducting layer(s), or traces, 224 of the flexible member 220 may be formed during the process of depositing various layers onto the release layer 205 to form the flexible member 220.

Figure 4:
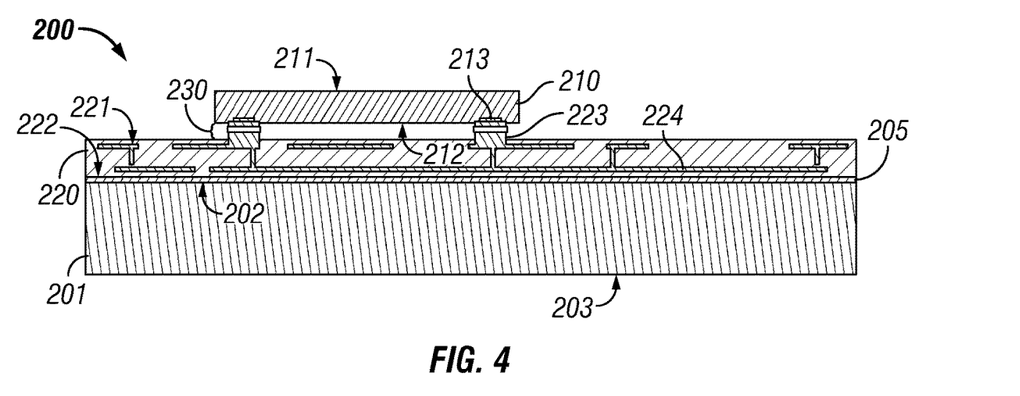
FIG. 4 is a schematic cross-section view of an embodiment of a semiconductor device assembly that includes a second substrate connected to a flexible member that is connected to a first substrate.

FIG. 4 shows a substrate 210, which may be comprised of various semiconductor devices such as a chip or die, having a top or first surface 211 and a plurality of pillars 213, or the like, extending from a bottom or second surface 212 connected to the top surface 221 of the flexible member 220. The pillars 213 of the substrate 210 are connected to the pads 223 to form electrical interconnects 230 between the substrate 210 and the flexible member 220. Various structures and/or methods maybe be used to form interconnects 230 between the substrate 210 and the flexible member 220 as would be appreciated by one of ordinary skill in the art having the benefit of this disclosure.

Figure 5:
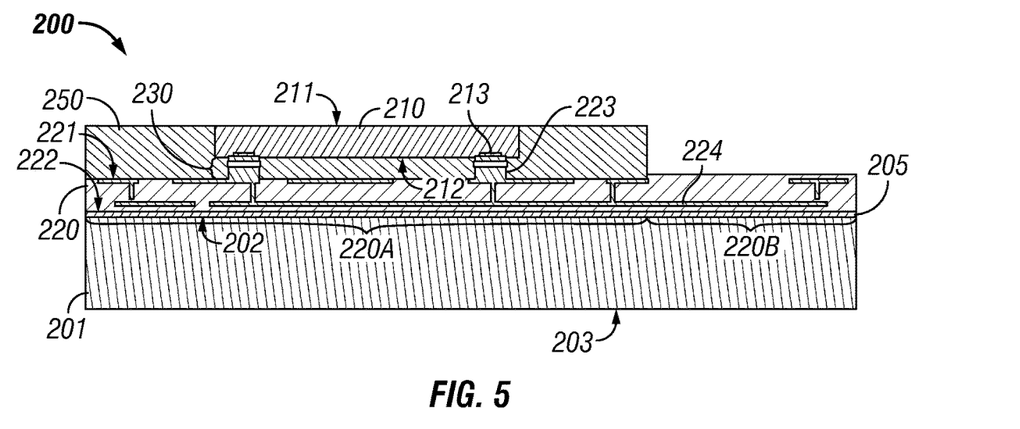
FIG. 5 is a schematic cross-section view of an embodiment of a semiconductor device assembly that includes material encapsulating at least a portion of a second substrate connected to a flexible member that is connected to a first substrate.

FIG. 5 shows a material 250 that encapsulates at least a portion of the substrate 210 and the interconnects 230. The material 250 may be comprised of various materials that may be used to encapsulate a portion of the semiconductor device assembly 200 as would be appreciated by one of ordinary skill in the art. For example, the material 250 may be, but is not limited to, mold compound and/or a non-conductive film. The encapsulating material 250 is positioned adjacent to a first portion 220A of the flexible member 220 whereas a second portion 220B of the flexible member 220 extends beyond the encapsulating material 250.

Figure 6:
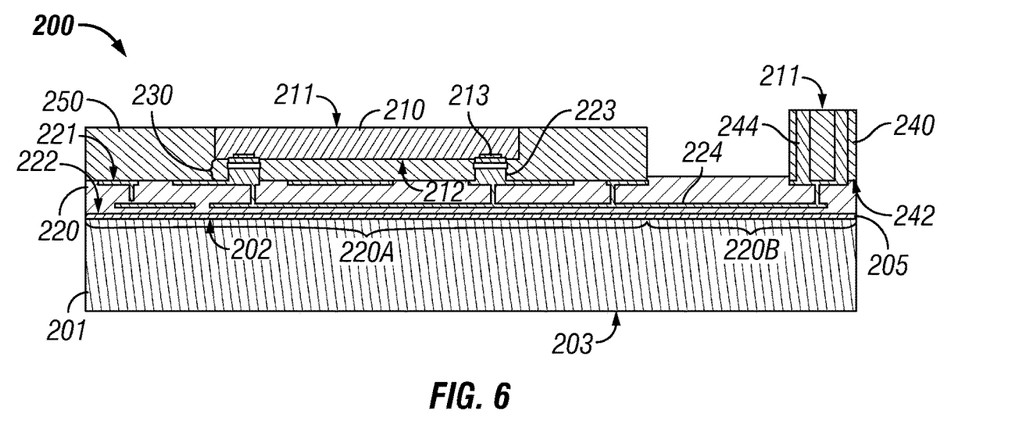
FIG. 6 is a schematic cross-section view of an embodiment of a semiconductor device assembly that includes a flexible member having a connector positioned between a first substrate and a second substrate.

FIG. 6 shows a connector 240 having a top end 241 and a bottom end 242 connected to the second portion 220B of the flexible member 220. The connector 240 includes internal electrical connections 244 that are connected to the conducting layer(s), or traces, 224 of the flexible member 220. The connector 240 is electrically connected to the substrate 210 via the conducting layers 224 of the flexible member 220 and the interconnects 230 between the substrate 210 and the flexible member 220. The connector 240 enables the substrate 210 to be selectively connected to and disconnected from an external assembly, which may be a PCB, or the like, or another semiconductor device assembly as would be appreciated by one of ordinary skill in the art having the benefit of this disclosure. The connector 240 may be attached to the flexible member 220 by various mechanisms depending on the application as would be appreciated by one of ordinary skill in the art having the benefit of this disclosure. For example, the connector 240 may be attached by, but is not limited to, soldering and/or applying an epoxy. The connector 240 may be configured to be inserted into a corresponding receptacle. Likewise, the connector 240 may be a receptacle configured to receive a corresponding plug or connector as would be appreciated by one of ordinary skill in the art.

Figure 7:
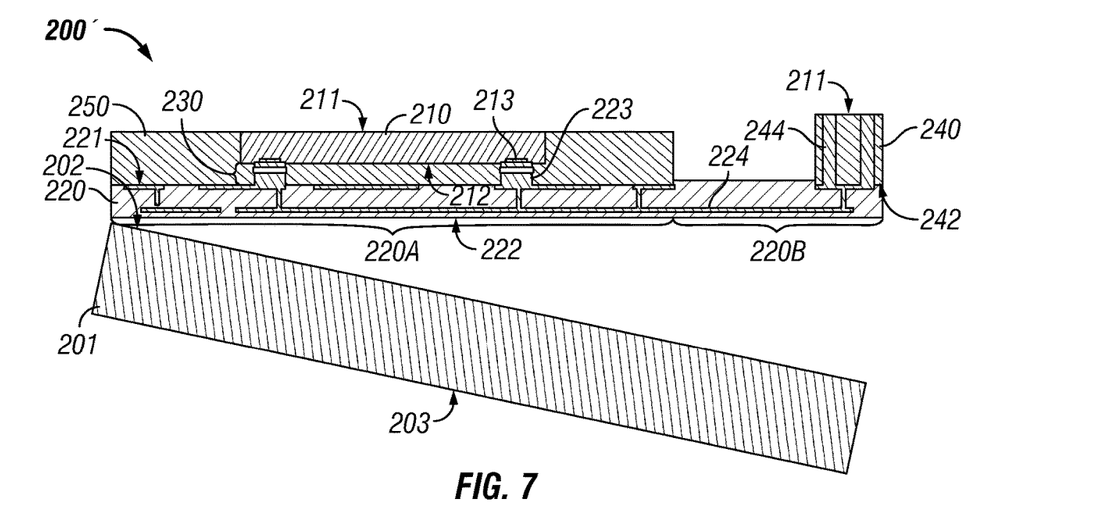
FIG. 7 is a schematic cross-section view of an embodiment of a semiconductor device assembly of a second substrate connected to a flexible member removed from a first substrate.

FIG. 7 shows a semiconductor device assembly 200' comprised of the second substrate 210, the encapsulating material 250, the flexible member 220, and the connector 240 being removed from the first substrate 201. Various mechanism and/or methods may be used to selectively release the semiconductor device assembly 200' from the first substrate 201 as would be appreciated by one of ordinary skill in the art having the benefit of this disclosure. For example, a solvent, a laser, and/or heat may be used to cause the release layer 205 to release the semiconductor device assembly 200' from the first substrate 201. Mechanical debonding may be another example of a mechanism used to release the semiconductor device assembly 200' from the first substrate 201.

After the semiconductor device assembly 200' is removed from the first substrate 201, the second portion 220B of the flexible member 220 may be used to selectively connect the semiconductor device assembly 200', and more specifically the semiconductor device(s) 210, to an external device or assembly via the connector 240. The flexible member 220 may enable the semiconductor device assembly 200' to be removed from a PCB, or the like, without damaging the semiconductor device assembly 200'. Additionally, the flexible member 220 of the semiconductor device assembly 200' may permit the use of the semiconductor device assembly 200' in various applications that may include a flexible substrate and/or a curved substrate. For example, the semiconductor device assembly 200' may be potentially be applied to, but not limited to, fabric, such as on clothing, on a wristband, and/or on a curved surface of glassware.

Figure 8:
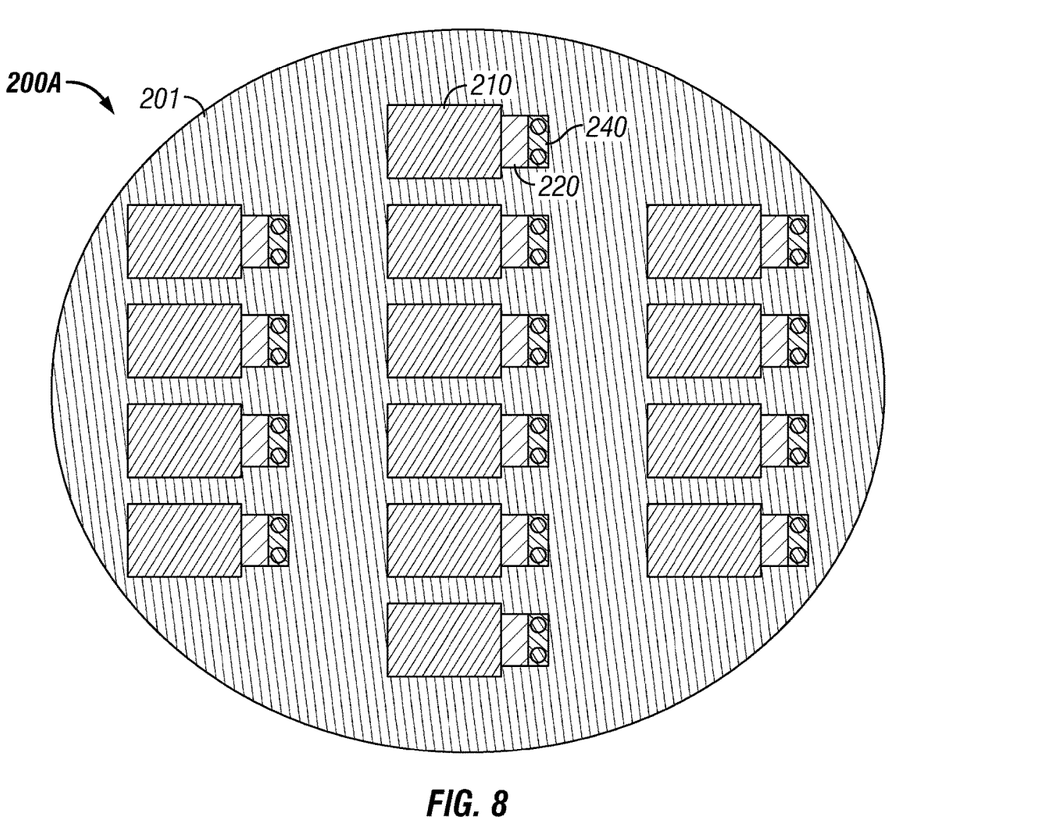
FIG. 8 is schematic of an embodiment of a plurality of semiconductor device assemblies on a carrier substrate.

FIG. 8 shows a schematic of a semiconductor device assembly 200A that includes a first substrate 201, which is a carrier wafer. The first substrate 201 includes a plurality of semiconductor devices 210 that are connected to a connector 240 via flexible members 220. A plurality of semiconductor devices assemblies 200' comprised of a semiconductor device 210, connected to a connector 240 via a flexible member 220 may be formed on a single substrate 201. The individual semiconductor device assemblies 200' may then be released from the wafer 201, as discussed herein. An encapsulating material 250 (shown in FIG. 7), which may be used to protect the semiconductor device 210, may be used to encapsulate the semiconductor devices 210 as would be appreciated by one of ordinary skill in the art. The size, shape, number, location, and/or configuration of the substrate 201, semiconductor devices 210, flexible members 220, and connectors 240 as shown for illustrative purposes only and may be varied as would be appreciated by one of ordinary skill in the art having the benefit of this disclosure.

Figure 9:
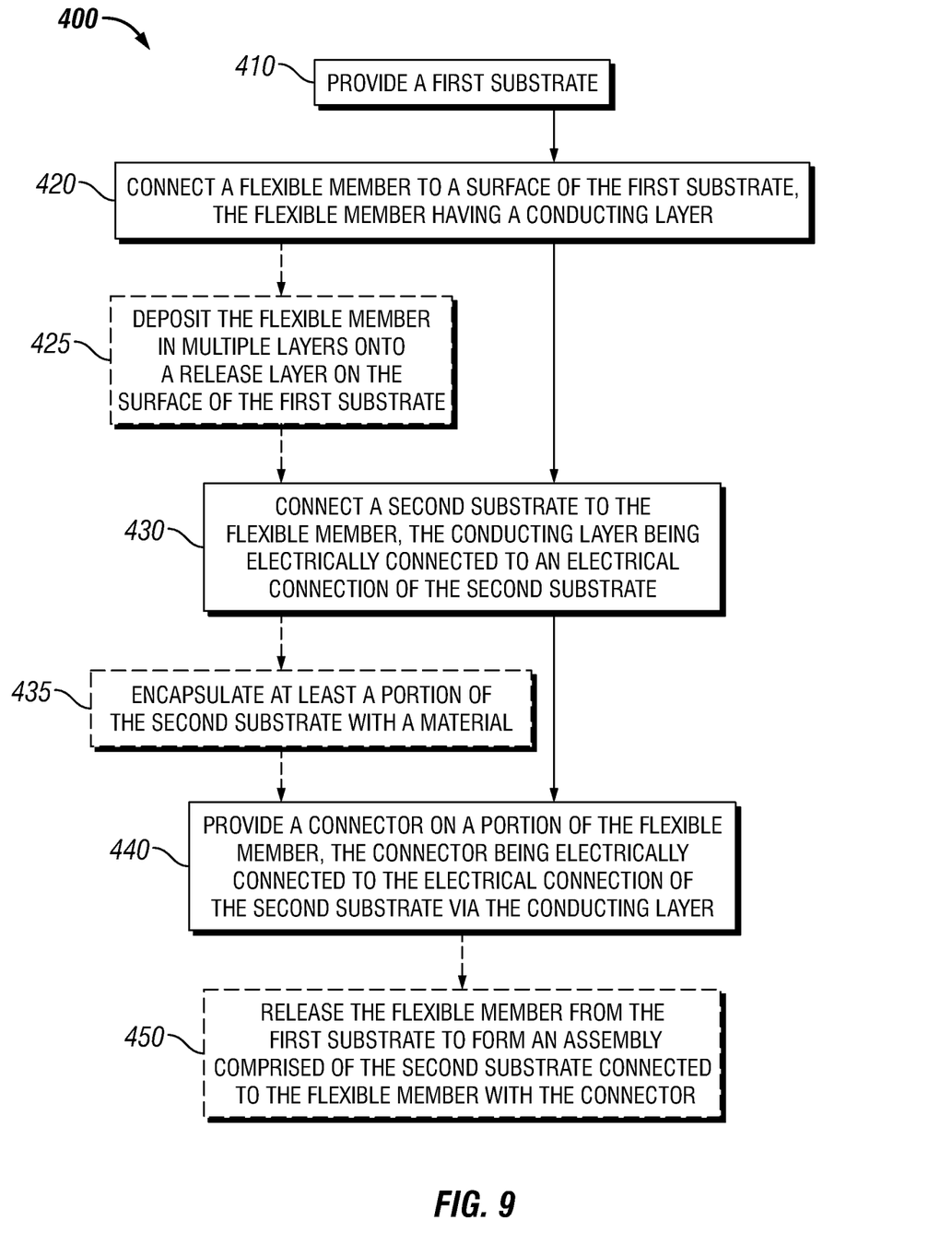
FIG. 9 is a flow chart of one embodiment of a method of forming a semiconductor device assembly.

FIG. 9 shows an embodiment of a method 400 of forming a semiconductor device assembly. The method 400 includes providing a first substrate, at step 410. The first substrate may be various substrates. For example, the first substrate may be, but is not limited to, a silicon wafer or a glass substrate. The method 400 comprises connecting a flexible member to a surface of the first substrate, at step 420. The flexible member includes a conducting layer(s) or traces within the flexible member. The method 400 may include the optional step 425 of depositing the flexible member in multiple layers onto a release layer on the surface of the first substrate.

At step 430, the method 400 includes connecting a second substrate to the flexible member. The conducting layer within the flexible member is electrically connected to an electrical connection of the second substrate. The second substrate may be, but is not limited to, a semiconductor device, such as a chip or a microchip. The second substrate may comprises a plurality of semiconductor devices connected together. The method 400 may comprise the optional step 435 of encapsulating at least a portion of the second substrate with a material. Various materials may be used to encapsulate the second substrate and may protect the second substrate. The encapsulating material may also encapsulate a portion of the flexible member that is connected to the second substrate.

The method 400 includes providing a connector on a portion of the flexible member, at step 440. The connector is electrically connected to the second substrate via the conducting layer within the flexible member. The connector is connected to a portion of the flexible member that extends away from the second substrate. The connector may be a connector configured to be plugged into a corresponding receptacle or the connector may be a receptacle configured to receive a corresponding connector as would be appreciated by one of ordinary skill in the art having the benefit of this disclosure. The method 400 may include the optional step 450 of releasing the flexible member from the first substrate to form an assembly comprised of the second substrate connected to the flexible member with the connector. The flexible member may be released from the first substrate via a releasing layer that may be configured to selectively release the flexible member in various ways. For example, the heating of the semiconductor device assembly may cause the release layer to release the flexible member. Alternatively, a mechanical force may be applied to release the flexible member or a solvent may be applied to the release layer. Various other methods may be used to selectively release the flexible member as would be appreciated by one of ordinary skill in the art having the benefit of this disclosure.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A semiconductor device assembly comprising:
   a substrate having a first surface and a second surface;
   at least one pillar on the second surface of the substrate;
   a flexible member having first surface and a second surface opposite of the first surface, the flexible member having traces positioned within the flexible member and at least one pad on the first surface of the flexible member, the flexible member having a first portion adjacent to the substrate and a second portion positioned away from the substrate, wherein the traces are electrically connected to the substrate via an interconnection between the at least one pillar and the at least one pad;
   a connector on the second portion of the flexible member, the connector including at least one electrical connection within the connector, wherein the at least one electrical connections of the connector is electrically connected to the substrate via the traces within the flexible member; and
   wherein the connector is configured to be inserted into or removed from a corresponding connection without movement of the first portion of the flexible member.

2. The semiconductor device assembly of claim 1, wherein the second portion of the flexible member may be rolled up into a roll.

3. The semiconductor device assembly of claim 1, further comprising a mold compound encapsulating at least a portion of the semiconductor device assembly.

4. The semiconductor device assembly of claim 1, wherein the flexible member further comprises a polyimide film, a polyetheretherketone film, a dielectric material, an organic dielectric material, or a combination thereof.

5. A semiconductor device assembly comprising:
a first substrate;
a release layer on a surface of the first substrate;
a flexible member having an internal conducting layer, a first surface, and a second surface opposite of the first surface, the internal conducting layer being buried within a flexible insulating material of the flexible member, wherein at least a portion of internal conducting layer is exposed on the first surface of the flexible member and wherein the release layer selectively bonds the second surface of the flexible member to the surface of the first substrate;
a connector connected to a portion of the flexible member, an electrical connection within the connector being electrically connected to the internal conducting layer of the flexible member; and
a second substrate being electrically connected to the internal conducting layer of the flexible member via the exposed conducting layer on the first surface of the flexible member, the connector being electrically connected to the second substrate via the internal conducting layer of the flexible member, wherein the release layer is configured to selectively release the flexible member, connector, and second substrate from the first surface of the first substrate.

6. The semiconductor device assembly of claim 5, wherein the release layer is an optical release layer.

7. The semiconductor device assembly of claim 6, wherein the release layer is configured to release the flexible member from the surface of the first substrate by the application of heat.

8. The semiconductor device assembly of claim 5, wherein the first substrate comprises a carrier wafer.

9. The semiconductor device assembly of claim 5, wherein the first substrate comprises glass, silicon, or a combination thereof.

10. The semiconductor device assembly of claim 5, wherein the release layer is configured to release the flexible member from the surface of the first substrate by the application of a solvent.

11. The semiconductor device assembly of claim 5, wherein the release layer is configured to release the flexible member from the surface of the first substrate by the application of a laser.

* * * * *